(12) United States Patent
Dietze et al.

(10) Patent No.: US 6,565,651 B2
(45) Date of Patent: May 20, 2003

(54) OPTIMIZED SILICON WAFER STRENGTH FOR ADVANCED SEMICONDUCTOR DEVICES

(75) Inventors: Gerald R. Dietze, Portland, OR (US);
Sean G. Hanna, Portland, OR (US);
Zbigniew J. Radzimski, Brush Prairie, WA (US)

(73) Assignee: SEH America, Inc., Vancouver, WA (US)

( * ) Notice: Subject to any disclaimer, the term of this patent is extended or adjusted under 35 U.S.C. 154(b) by 99 days.

(21) Appl. No.: 09/759,110

(22) Filed: Jan. 11, 2001

(65) Prior Publication Data

US 2002/0020340 A1 Feb. 21, 2002

(51) Int. Cl.[7] ................................................ C30B 15/18
(52) U.S. Cl. .............................. 117/29; 117/19; 117/28
(58) Field of Search ................................ 117/19, 28, 29

(56) References Cited

U.S. PATENT DOCUMENTS

| | | | |
|---|---|---|---|
| 2,842,467 A | 7/1958 | Landauer et al. | |
| 4,330,359 A | 5/1982 | Shlichta | |
| 4,548,670 A | 10/1985 | Pinkhasov | |
| 5,357,898 A | 10/1994 | Kurosawa et al. | |
| 5,723,337 A | 3/1998 | Muller et al. | |
| 5,803,977 A | 9/1998 | Tepman et al. | |
| 5,834,363 A | 11/1998 | Masanori | |
| 5,882,398 A | 3/1999 | Sonokawa et al. | |
| 5,911,826 A | 6/1999 | Hiraishi et al. | |
| 5,935,320 A | 8/1999 | Graef et al. | |
| 5,993,493 A | 11/1999 | Takamizawa et al. | |
| 6,001,175 A | 12/1999 | Maruyama et al. | |
| 6,059,875 A | 5/2000 | Kirkland et al. | |
| 6,077,343 A | 6/2000 | Iida et al. | |
| 6,228,165 B1 | 5/2001 | Baba et al. | |
| 6,261,361 B1 * | 7/2001 | Iida et al. | 117/19 |
| 6,316,361 B1 | 11/2001 | Hansson | |
| 6,375,749 B1 | 4/2002 | Boydston et al. | |

FOREIGN PATENT DOCUMENTS

| | | |
|---|---|---|
| DD | 10 47 390 B | 12/1958 |
| EP | 0 319 031 A2 | 6/1989 |
| EP | 0 462 741 A2 | 12/1991 |
| GB | 2 198 966 A | 6/1988 |
| JP | 62-275087 A | 11/1987 |
| WO | WO86/02919 A1 | 11/1984 |
| WO | WO99/57344 A1 | 11/1999 |

OTHER PUBLICATIONS

*CZ Silicon Crystal Grown in Transverse Magnetic Fields*, K. Hoshi et al., Extended Abstracts, vol. 80–1, 1980, pp. 811–813.
*Controlling the Oxygen Concentration of Silicon Crystals by Magnetically Induced Melt Rotation*, E. M. Hull, IBM Technical Disclosure Bulletin, vol. 23, No. 7A, Dec. 1980.
Semiconductor Silicon Crystal Technology, F. Shimura, Academic Press, Inc., San Diego, CA, 1988, pp. 178–181.
Stanley Wolf and Richard N. Tauber, *Silicon Processing For The VLSI Era, vol. 1: Process Technology*, Lattice Press, Sunset Beach, CA, USA, pp. 1–72, 124–159, 1986.

* cited by examiner

*Primary Examiner*—Felisa Hiteshew
(74) *Attorney, Agent, or Firm*—Alston & Bird LLP

(57) ABSTRACT

A method of manufacturing a damage-resistant silicon wafer is provided. The method comprises adding polycrystalline silicon to a crucible, adding a nitrogen-containing dopant to the crucible, heating the polycrystalline silicon to form a melt of nitrogen-doped silicon, pulling a nitrogen-doped silicon crystal from the melt using a seed crystal according to the Czochralski technique, forming a silicon wafer from the silicon crystal, the silicon wafer having an edge, and rounding the edge of the silicon wafer. The method may optionally include applying an electrical potential across the crucible while pulling the nitrogen-doped silicon crystal from the melt.

23 Claims, 4 Drawing Sheets

OPTIMIZED SILICON WAFER STRENGTH FOR ADVANCED SEMICONDUCTOR DEVICES

CROSS-REFERENCE TO OTHER APPLICATIONS

The present application incorporates by reference the contents of U.S. patent application Ser. No. 09/362,103 entitled METHOD OF MANUFACTURING CRYSTAL OF SILICON USING AN ELECTRIC POTENTIAL, filed Jul. 28, 1999, and issued May 8, 2001 as U.S. Pat. No. 6,228,165.

TECHNICAL FIELD

The present invention relates to a method of manufacturing a semiconductor wafer. More particularly, the invention provides a method of manufacturing a wafer that improves the resistance of the wafer to mechanical damage that may occur during downstream processing steps.

BACKGROUND OF THE INVENTION

Wafer breakage presents a serious problem in the manufacturing of semiconductor devices. The breakage of a single wafer may shut down a processing tool for an extended period of time while the tool is being cleaned, lowering productivity. Furthermore, in a batch process, the breakage of a single wafer may contaminate all of the other wafers in the batch, potentially ruining a large number of wafers at great expense.

One common cause of wafer breakage is the presence of microscopic damage, such as microcracks or chips, in the wafer. When a wafer with such damage is heated in a processing step, the thermal stresses formed in the wafer may cause the crack to propagate, leading to the fracture of the wafer.

Besides causing breakage, the presence of damage in the edges of a wafer can also lead to stresses in the crystalline lattice of the wafer. These stresses may result in defects, such as dislocations, that are vulnerable to slip propagation when the wafer is heated. These defects may cause the wafer to warp when it is heated, and may also impede the performance of devices fabricated on the wafer.

Many steps in both wafer manufacturing and circuit fabrication processes may damage the wafer in ways that can later lead to defects and wafer breakage. For example, microcracks may occur during the crystal growth process due to thermal stresses in the silicon crystal. Also, the wafers may be chipped or otherwise damaged by the apparatuses that hold the wafer during and between processing steps. Finally, some processing steps themselves, such as mechanical lapping and grinding, may damage the wafer in ways that can lead to the defect formation, wafer warp or wafer breakage in downstream processes.

To curb the danger of wafer warp or breakage, wafer manufacturing processes generally include various steps for removing damage caused by earlier processing steps. For example, etching and polishing steps generally follow mechanical grinding steps to remove damage caused by the grinding step. Similarly, edge polishing steps are used to remove damage in the edges of the wafers caused by wafer cutting and edge shaping processes.

Though these steps are effective to remove damage that occurs during upstream processing steps, they may be ineffective to lessen the impact of damage that may occur in downstream processing steps. For example, an edge-polishing step that removes damage caused in the wafer cutting step is ineffective to prevent later damage to the edges from propagating. Furthermore, some of the damage-removal steps may expose new surfaces on the wafer that are susceptible to damage. For example, beveling the edge of a wafer to remove wafer-cutting damage typically forms one or more sharp corners on the wafer edge that may be susceptible to chipping or cracking in downstream processes. Edge rounding is superior to edge beveling for preventing downstream damage, but still does not help to alleviate the problems that arise once the wafer edge has been damaged.

Therefore, it would be desirable to have a method of manufacturing a wafer that produces a wafer with improved resistance to breakage and defect propagation caused by downstream processing steps.

SUMMARY OF THE INVENTION

The present invention provides a method of manufacturing a silicon wafer. The method comprises adding polycrystalline silicon to a crucible, adding a nitrogen-containing dopant to the crucible, heating the polycrystalline silicon to form a melt of nitrogen-doped silicon, pulling a nitrogen-doped silicon crystal from the melt using a seed crystal according to the Czochralski technique, forming a silicon wafer from the silicon crystal, the silicon wafer having an edge, and rounding the edge of the silicon wafer. The method may optionally include applying an electrical potential across the crucible while pulling the nitrogen-doped silicon crystal from the melt.

DETAILED DESCRIPTION OF THE PREFERRED EMBODIMENT

Figure 1:
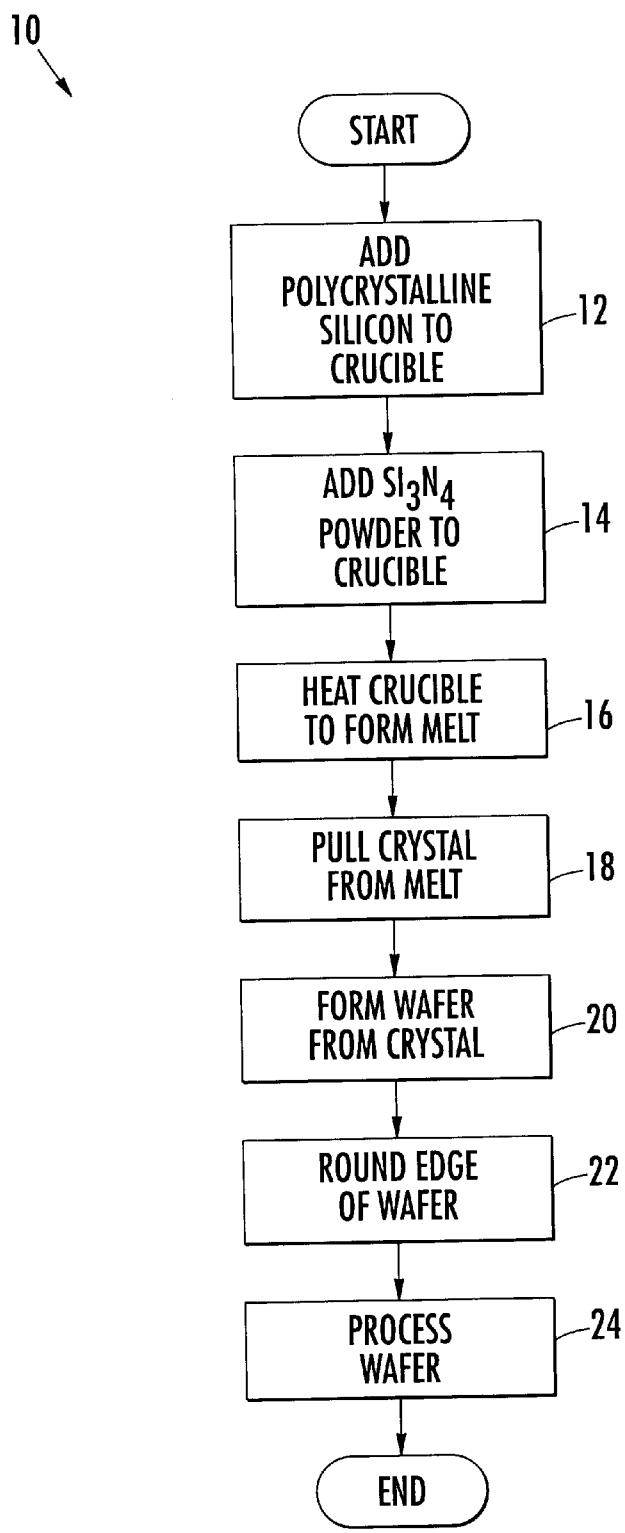
FIG. 1 is a flow diagram showing a method of manufacturing a silicon wafer according to a first embodiment of the present invention.

The present invention provides a method of manufacturing a damage-resistant silicon wafer. A wafer made in accordance with the present invention offers superior resistance both to mechanical damage caused by downstream processes and to the propagation of defects, such as dislocations, compared to known wafers. One embodiment of the present invention is illustrated generally at 10 in FIG. 1. Method 10 includes forming a charge, or melt, from which a silicon crystal may be pulled by adding silicon to a crucible at 12, and then adding a nitrogen containing dopant, such as silicon nitride, at 14. Next, the crucible is heated at 16 to form a nitrogen-containing silicon melt, from which a nitrogen-doped crystal is pulled according to the Czochralski technique at 18. A wafer is then formed from the crystal at 20, and the edge of the wafer is rounded at 22. After rounding the edge of the wafer at 22, other processes may be performed on the wafer at 24 with less risk of causing damage to or breakage of the wafer.

The nitrogen doping of the crystal and the rounding of the wafer edge combine to improve the mechanical strength and damage resistance of the wafer compared to currently known wafers. First, the round edge reduces the susceptibility of the wafer edge to damage from downstream processes, as the edge has no sharp corners susceptible to chipping or cracking by processing machinery. This, in turn lowers the susceptibility of the wafer to breakage, as the reduction in the likelihood of edge damage also causes a reduction the likelihood of crack propagation stemming from edge damage. Second, the nitrogen present in the wafer combines with oxygen in the silicon crystal to form precipitates that act as stops to minimize slip propagation. Defects susceptible to slip propagation may have many sources. For example, the wafer may have defects caused by thermally-induced strain arising from the crystal growth process. It may also have defects caused by mechanically-induced strain arising from damage suffered during various wafer manufacturing processes. The nitrogen pins the defects and prevents their propagation during downstream processing steps. Thus, the nitrogen helps to prevent damage and defects from propagating in the wafer during thermal cycling in various processes, thus improving the resistance of the wafer to warp and breakage.

The adding of silicon to the crucible at 12 may be performed in any suitable manner. Generally, electrical grade polycrystalline silicon is added to a fused silica or quartz crucible in either chunk or granular form. If desired, a dopant may be added to the crucible along with the polycrystalline silicon to form a p or n type crystal. This dopant may be added to the crucible in any desired manner, such as by adding a heavily-doped silicon alloy to the crucible along with the polycrystalline silicon.

Similarly, the adding of a nitrogen-containing dopant to the crucible at 14 may be performed in any desired manner. For example, a nitrogen-containing gas, such as nitrogen gas or nitrous oxide, can be added to the atmosphere within the puller so that nitrogen is dissolved into the melt at the gas-melt interface. Nitrogen can also be added to the melt in solid form. For example, as known in the art, the inner wall of the crucible can be coated with silicon nitride so that some nitrogen is incorporated into the silicon melt as the walls of the crucible degrade, or silicon nitride-coated wafers may be dissolved into the melt. In the preferred embodiment, silicon nitride is added to the crucible at 14 in powdered form before the crucible is heated to form the melt at 16, as described in U.S. Pat. No. 6,059,875 to Kirkland et al., which is incorporated by reference herein. In this method, granular silicon nitride is added to the crucible before the crucible is heated so that the nitrogen dissolves into the silicon as the silicon is melted. This method minimizes the number of steps necessary to perform the nitrogen doping, and thus lessens the cost of the overall wafer manufacturing process.

While granular silicon nitride is a preferred nitrogen-containing dopant, other suitable granular nitrogen-containing dopants may also be used. Suitable dopants include those that introduce minimal amounts of other contaminants or dopants into the melt besides the desired quantity of nitrogen.

The granular nitrogen-containing dopant may have any desired average particle size. Generally, the rate of dissolution of the nitrogen-containing dopant into the silicon melt is inversely proportional to the average particle size of the dopant; the larger the average particle size, the slower the dissolution into the melt. This is because the surface area of dopant exposed to the silicon melt relative to the overall mass of dopant added to the crucible decreases with increasing particle size. Thus, to decrease the time necessary to dissolve the dopant, it is preferable to use relatively fine-ground powder. An example of a suitable powder is a powder with an average particle size of 3 mm or less.

The nitrogen-containing dopant is generally added in a sufficient quantity to improve the resistance of the wafer to mechanical damage, yet in a low enough quantity not to alter the conductivity of the wafers appreciably. Generally, the nitrogen-containing dopant is added in a quantity sufficient to give wafers formed from the melt a nitrogen concentration of between $1 \times 10^{10}$ and $5 \times 10^{15}$ nitrogen atoms/cm$^3$, and more preferably between $5 \times 10^{13}$ and $6 \times 10^{14}$ nitrogen atoms/cm$^3$. While these ranges are preferred ranges, it is to be understood that the wafers may have concentrations of nitrogen outside of these ranges as well and still be within the scope of the present invention.

The nitrogen-containing dopant may be added to the melt at any desired time before the pulling of the crystal. Generally, enough time should be allowed for the nitrogen-containing dopant to dissolve completely and mix uniformly into the silicon melt before pulling the crystal. In the depicted embodiment, the nitrogen-containing dopant is added to the crucible before the crucible is heated so that the dopant dissolves into the silicon as the silicon melts. However, it is also possible to add the dopant to the crucible either during the melting process, or after the silicon has been completely melted.

Heating the crucible to form the melt at 16 may be performed in any suitable manner. The heating generally involves first pumping out the pulling chamber, backfilling the chamber with an inert gas and then heating the crucible until the silicon is melted. The crucible is typically supported by a susceptor, and heated by one or more heating elements that are arranged around the susceptor.

Similarly, pulling a nitrogen-doped crystal from the melt at 18 may be performed in any suitable manner. Generally, it is performed in accordance with the Czochralski technique. This technique involves first lowering a seed crystal into the melt to form a solid-liquid interface, and then pulling the seed crystal upward in such a manner that a silicon crystal continually grows at the solid-liquid interface. The crucible and crystal are continuously rotated in opposite directions as the crystal is pulled upward.

The speed at which the crystal is pulled from the melt may affect various properties of the silicon crystal. For example, crystals grown by the Czochralski technique often have defects formed by the agglomeration of point vacancies within the crystal. These defects generally have oxygen and, in nitrogen-doped crystals, nitrogen-oxygen precipitates incorporated into the walls of the defect. When a wafer with such defects is treated with an SC-1 cleaning process, these defects are manifested as crystal-originated particles, or COP. Pulling the crystal at a higher rate leads to the formation of a larger concentration of COP than pulling the crystal at a lower rate. However, pulling the crystal at a higher rate decreases the size of the COP relative to pulling at a slower rate. Thus, the use of a faster pulling speed results in the formation of a higher concentration of smaller-sized voids, which may improve the resistance of the wafer to the propagation of defects by distributing the nitrogen-oxygen precipitates more evenly within the wafer. An example of a slower pulling speed is about 0.95 mm/min, and examples of faster pulling speeds are from 1.1 to 1.3 mm/min. Although a constant pulling rate is preferred for pulling the part of the crystal from which wafers are to be cut, a variable pulling rate may also be used.

After the crystal has been pulled from the melt, the crystal is shaped, and then a wafer is formed from the crystal at 20.

The wafer may be formed in any suitable manner. Generally, wafers are sliced from the crystal ingot with a cutting tool such as a diamond-edged inner diameter saw or wire saw.

Figure 2:
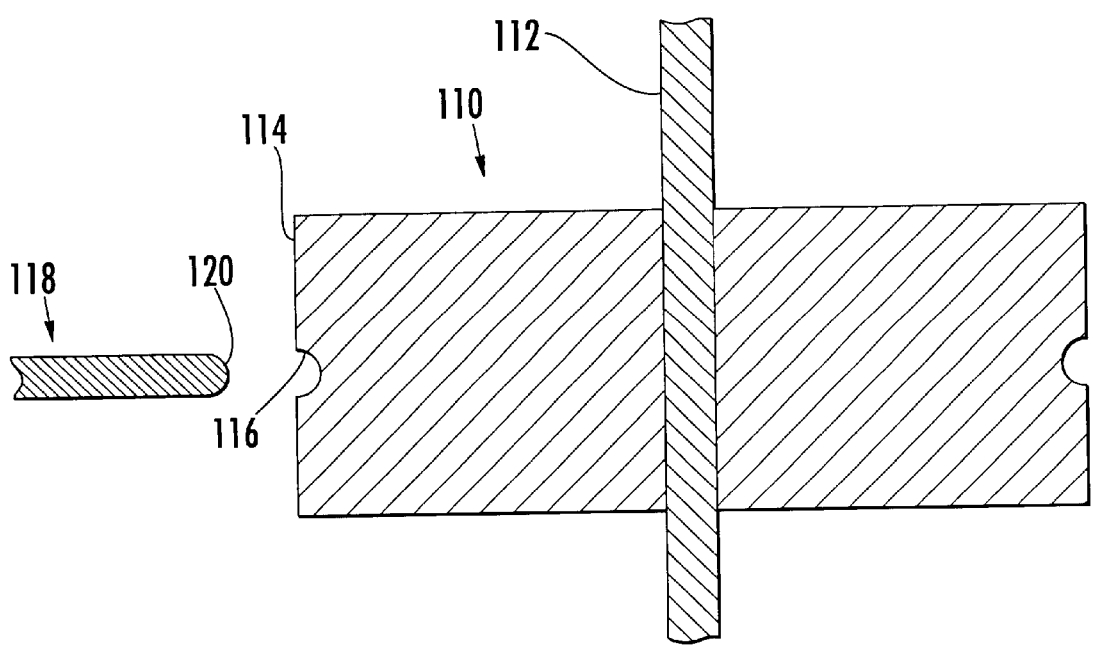
FIG. 2 is a sectional view of a grinding wheel suitable for rounding a wafer edge in accordance with the embodiment of FIG. 1.

After slicing the wafer from the ingot, the edge of the wafer is rounded at 22. As described above, a rounded-edge wafer has superior damage resistance compared to a beveled-edge wafer, as the rounded edge presents no sharp corners that can be easily damaged by wafer processing machinery. Furthermore, the rounded edge can be formed in a single grinding step, whereas the beveled edge is formed from three separate grinding steps. In a beveling process, each corner of the wafer edge is separately ground into a surface that tapers away from the wafer face toward the wafer edge, and then the remaining portion of the wafer edge is ground flat. In contrast, the edge-rounding process of the present invention is performed with a single grinding step. In this step, the edge of the wafer is ground with a grinding wheel having a continuously curved, concave grinding surface, as shown generally at 110 in FIG. 2. Grinding wheel 110 includes an axle 112 about which the wheel is spun. Grinding wheel 110 also includes a grinding surface 114 with a continuously curved, concave depression 116. Depression 116 is sized to fit the edge of a wafer, and has the same contour as that which is to be imparted to the wafer edge. FIG. 2 also shows a wafer 118 that has had its edge 120 rounded by grinding wheel 110.

Depression 116 may have any desired rounded profile to give wafer edge 120 any shape that lacks sharp edges susceptible to damage. In the depicted embodiment, depression 116 has a constant radius so that it will impart a curvature of constant radius to the wafer edge. Although wafer edge 120 is preferably rounded in a single step with an apparatus such as grinding wheel 120, it may also be rounded in a plurality of grinding steps if desired.

After rounding the wafer edge at 22, the wafer is ready to undergo other processes at 24. The other processes may include further processing in the manufacture of the wafer itself, or may include the fabrication of integrated circuits on the wafer. Whatever the process, the combination of the nitrogen doping and edge rounding of the wafer, and optionally the fast-pulling of the silicon crystal from which the wafer is formed, combine to give the wafer improved strength.

Figure 3:
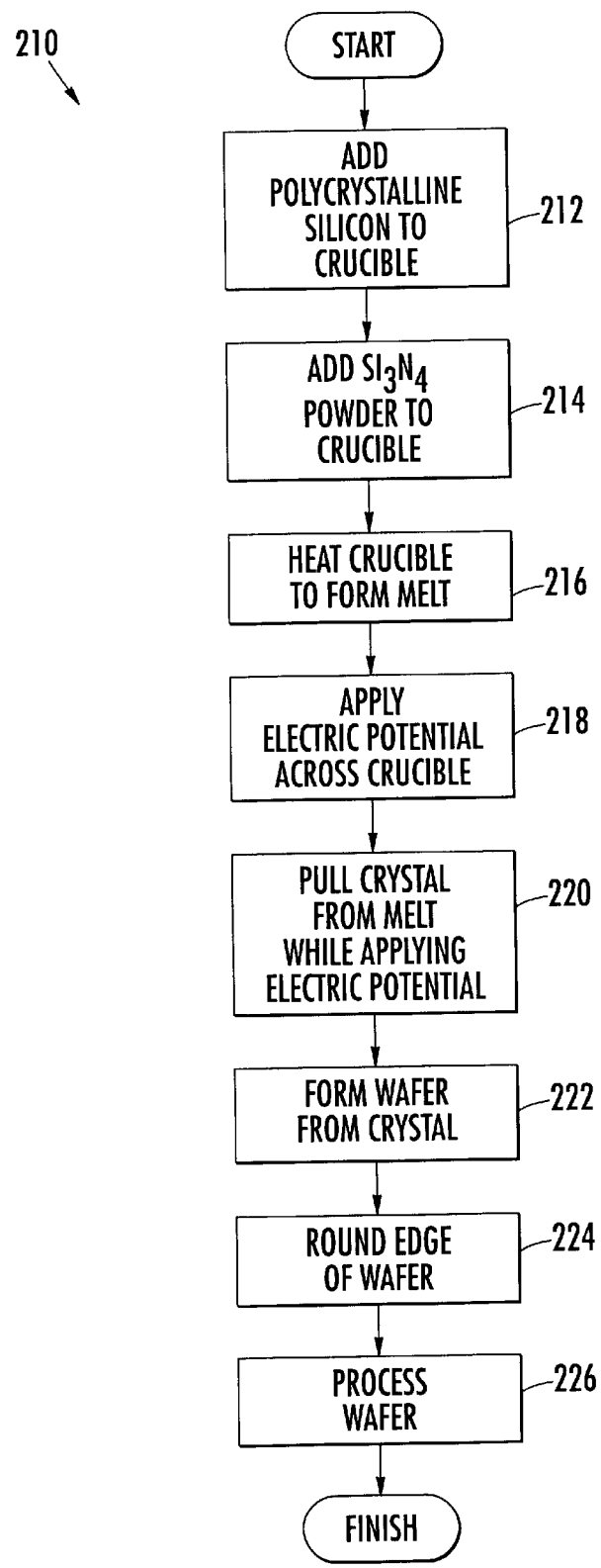
FIG. 3 is a flow diagram showing a method of manufacturing a silicon wafer according to a second embodiment of the present invention.

A second embodiment of the present invention is shown generally in FIG. 3 as method 210. Like method 10, method 210 includes the initial steps of adding polycrystalline silicon to a crucible at 212, adding a nitrogen-containing dopant, such as silicon nitride, to the crucible at 214, and heating the crucible to form a melt at 216. However, method 210 also includes applying an electrical potential across the crucible at 218, and pulling the crystal from the melt while applying the electrical potential at 220.

Applying an electrical potential across the crucible while pulling the crystal from the melt helps to improve the strength and damage resistance of a wafer even more than nitrogen doping and edge rounding alone. This is because the application of the electrical potential lowers the likelihood that the wafer will be contaminated with impurities introduced into the melt from the crucible wall.

During the crystal growth process, portions of the inner wall of the quartz crucible undergo a phase transition to a β-cristobalite structure due to the heat and chemical interactions with the silicon melt. As the degradation of the inner surface of the crucible occurs, the β-cristobalite portions of the inner crucible wall may be undercut and released into the silicon melt. Small particles of this phase may be incorporated into a crystal being pulled from the melt, possibly causing dislocations in the crystal that may in turn be susceptible to slip propagation in downstream wafer processing steps.

The application of an electrical potential across the crucible may reduce or even eliminate the release of particles of β-cristobalite into the melt. While the exact process by which applying an electrical potential to a crucible prevents the release of β-cristobalite into the silicon melt is not known in detail, it is believed that the electrical potential causes substantially the entire inner surface of the crucible to undergo the phase transformation to β-cristobalite. This reduces the chance of regions of β-cristobalite present on the inner surface of the crucible from being undercut and released into the melt.

Figure 4:
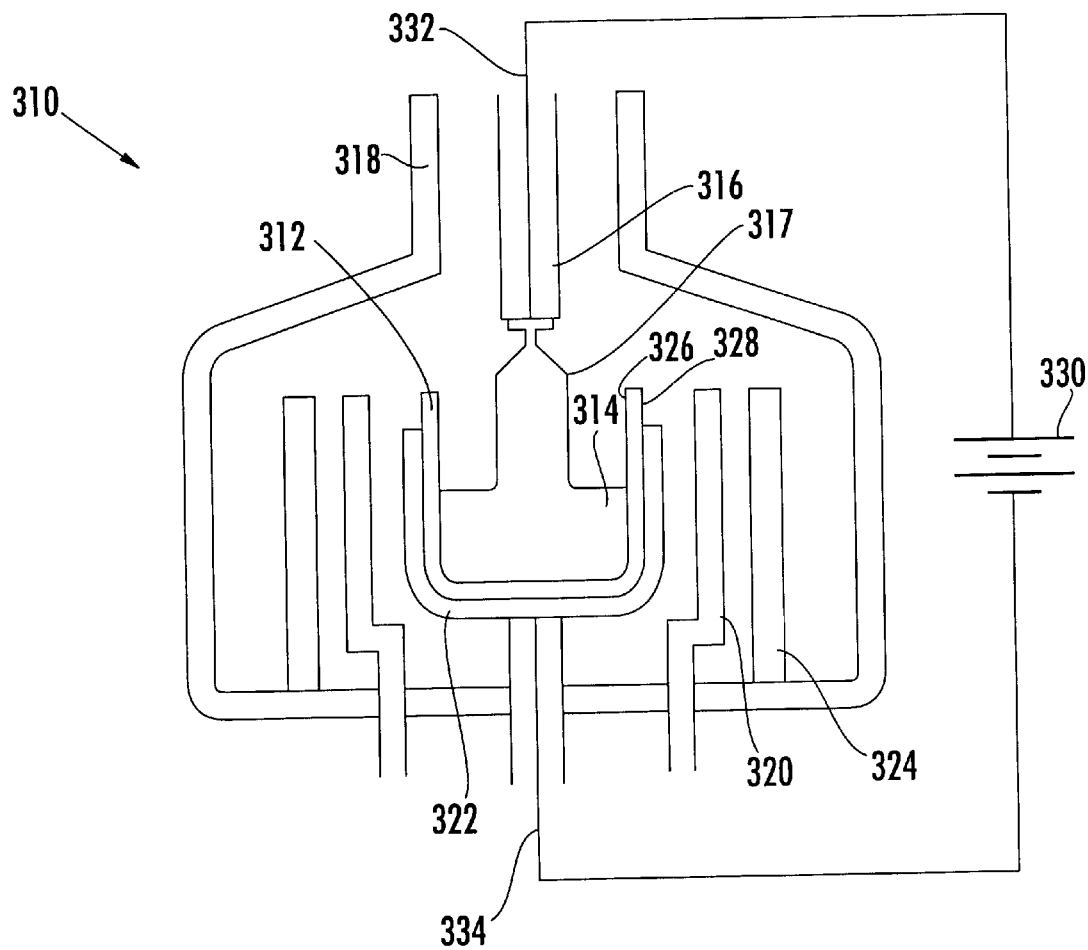
FIG. 4 is a sectional view of a puller suitable for pulling a crystal in accordance with the embodiment of FIG. 3.

The electrical potential may be applied across the crucible in any suitable fashion. One embodiment of a crystal pulling system for applying an electrical potential across a crucible is shown in FIG. 4. Pulling system 310 includes a crucible 312, typically made of a silicon-based material such as quartz or fused silica, in which silicon may be melted to form a melt 314. Pulling system 310 also includes a pulling member 316 for pulling a crystal 317 from crucible 312. Pulling member 316 is configured for holding a seed crystal that is dipped into melt 314 to initiate crystal growth, and for pulling crystal 317 from melt 314 as it grows. Pulling member 316 is coupled to various drive mechanisms (not shown) to control the upward and rotational movement of the member while crystal 317 is being pulled. Pulling system 310 also includes an outer wall 318 for isolating the melt from the outside atmosphere, one or more heating elements 320 for heating crucible 312, and a susceptor 322 in contact with crucible 312 for transferring heat to crucible 312. Heating element 320 and susceptor 322 are typically made of a refractory, electrically and thermally conductive material such as graphite. A heat-insulating cylinder 324 surrounds heating element 320 between outer wall 318 and heating element 320.

Pulling system 310 is configured to allow an electrical potential to be applied across crucible 312 by applying a first potential relative to ground to the inner surface 326 of the crucible, and a second potential relative to ground to the outer crucible surface 328. In the depicted embodiment, the first potential is applied to inner crucible surface 326 by applying the first potential to pulling member 316, and the second potential is applied to outer crucible surface 328 by applying the second potential to susceptor 322. A power supply 330 is connected across the crucible via a first lead 332 attached to pulling member 316 and a second lead 334 attached to susceptor 322. The first potential is transferred through crystal 317 and melt 314 to inner crucible surface 326, while the second potential is transferred through susceptor 322 to outer crucible surface 328.

Any suitable power supply that is capable of providing the desired electrical potential across the crucible may be used. Typically, the electrical potential will have a magnitude in the range of 1–100 V, more typically in the range of 3–24 V, and even more typically in the range of 8–12 V, although values outside of these ranges may also be used. Such voltages will typically result in the flow of a current in the range of from about 0.1 to about 300 mA, and more typically from about 1 to about 200 mA, through the crucible wall, though a current outside these values may also result from the potential applied across the crucible.

The electrical potential may be either constant or oscillating. If a constant potential is applied across the crucible, the more positive terminal of the power supply may be applied either to pulling member 216 or to susceptor 222, although it is typically applied to susceptor 222. In a particularly preferred embodiment of the invention, a 12 V DC potential is applied across the crucible at a current of about 2 to 15 mA.

Referring again to FIG. 3, after pulling the crystal from the melt while applying an electrical potential across the crucible at 220, a wafer may formed from the crystal at 222, and then the edge of the wafer may be rounded at 224. After the edge is rounded, the wafer is ready to under go other processes at 224.

Industrial Applicability

The present invention is applicable to the manufacture of semiconductor wafers, and more particularly to the manufacture of silicon wafers with improved resistance to damage such as warp or breakage that may occur in later manufacturing or circuit fabrication processes.

It is believed that the disclosure set forth above encompasses multiple distinct inventions with independent utility. While each of these inventions has been disclosed in its preferred form, the specific embodiments thereof as disclosed and illustrated herein are not to be considered in a limiting sense as numerous variations are possible. The subject matter of the inventions includes all novel and non-obvious combinations and subcombinations of the various elements, features, functions and/or properties disclosed herein. No single feature, function, element or property of the disclosed embodiments is essential to all of the disclosed inventions. Similarly, where the claims recite "a" or "a first" element or the equivalent thereof, such claims should be understood to include incorporation of one or more such elements, neither requiring nor excluding two or more such elements.

It is believed that the following claims particularly point out certain combinations and subcombinations that are directed to one of the disclosed inventions and are novel and non-obvious. Inventions embodied in other combinations and subcombinations of features, functions, elements and/or properties may be claimed through amendment of the present claims or presentation of new claims in this or a related application. Such amended or new claims, whether they are directed to a different invention or directed to the same invention, whether different, broader, narrower or equal in scope to the original claims, are also regarded as included within the subject matter of the inventions of the present disclosure.

We claim:

1. A method of manufacturing a silicon wafer, comprising:
    adding polycrystalline silicon to a crucible;
    adding a nitrogen-containing dopant to the crucible;
    heating the polycrystalline silicon to form a melt of nitrogen-doped silicon;
    pulling a nitrogen-doped silicon crystal from the melt using a seed crystal according to the Czochralski technique;
    forming a silicon wafer from the silicon crystal, the silicon wafer having an edge; and
    rounding the edge of the silicon wafer.

2. The method of claim 1, wherein adding a nitrogen-containing dopant to the crucible includes adding a nitrogen-containing dopant to the crucible before heating the silicon to form a melt.

3. The method of claim 2, wherein adding a nitrogen-containing dopant to the crucible before heating the silicon to form a melt includes adding a silicon nitride powder to the crucible.

4. The method of claim 3, wherein adding silicon nitride powder to the crucible includes adding silicon nitride powder with an average particle size of less than or equal to 3 millimeters in diameter to the crucible.

5. The method of claim 1, wherein adding a nitrogen-containing dopant to the crucible includes adding the nitrogen-containing dopant to the crucible while heating the silicon to form a melt.

6. The method of claim 1, wherein adding a nitrogen-containing dopant to the crucible includes adding a nitrogen-containing dopant to the crucible in a quantity sufficient to give the nitrogen-doped silicon crystal a nitrogen concentration of between $1 \times 10^{10}$ nitrogen atoms/cm$^3$ and $5 \times 10^{15}$ nitrogen atoms/cm$^3$.

7. The method of claim 1, wherein adding a nitrogen-containing dopant to the crucible includes adding a nitrogen-containing dopant to the crucible in a quantity sufficient to give the nitrogen-doped silicon crystal a nitrogen concentration of between $5 \times 10^{13}$ nitrogen atoms/cm$^3$ and $6 \times 10^{14}$ nitrogen atoms/cm$^3$.

8. The method of claim 1, wherein pulling a nitrogen-doped silicon crystal from the melt with a seed crystal includes pulling a nitrogen-doped silicon crystal from the melt at a rate of between 1.1 and 1.3 mm/min.

9. The method of claim 1, wherein rounding the edge of the silicon wafer includes mechanically rounding the edge of the silicon wafer.

10. The method of claim 9, wherein mechanically rounding the edge of the silicon wafer includes grinding the edge of the silicon wafer with a grinding wheel having a concave, continuously curved grinding surface.

11. The method of claim 1, wherein rounding the edge of the silicon wafer includes rounding the edge of the silicon wafer so that the radius of the edge is constant throughout the rounded portion of the edge.

12. The method of claim 1, the crucible having a wall, wherein pulling a nitrogen-doped silicon crystal from the melt using a seed crystal according to the Czochralski technique includes applying an electrical potential across the wall of the crucible while pulling the crystal from the melt.

13. The method of claim 1, wherein pulling a nitrogen-doped silicon cystal from the melt includes pulling a nitrogen-doped silicon crystal from the melt at a rate greater than 1.1 mm/min.

14. A method of manufacturing a damage-resistant silicon wafer, comprising:
    adding polycrystalline silicon to a crucible;
    adding a nitrogen-containing dopant to the crucible;
    heating the crucible to form a melt of nitrogen-doped silicon;
    applying an electrical potential across the crucible;
    pulling a nitrogen-doped silicon crystal from the melt with a silicon seed crystal according to the Czochralski technique;
    forming the wafer from the silicon crystal, the wafer having an edge; and
    rounding the edge of the silicon wafer.

15. The method of claim 14, wherein pulling a nitrogen-doped silicon crystal from the melt includes pulling a nitrogen-doped silicon crystal from the melt at a constant pulling rate.

16. The method of claim 14, wherein pulling a nitrogen-doped silicon crystal from the melt includes pulling a nitrogen-doped silicon crystal from the melt at a variable pulling rate.

17. The method of claim 14, wherein pulling a nitrogen-doped silicon crystal from the melt includes pulling a nitrogen-doped silicon crystal from the melt at a pulling rate of between 1.1 and 1.3 mm/min.

18. The method of claim 14, wherein rounding the edge of the silicon wafer includes mechanically rounding the edge of the silicon wafer.

19. The method of claim 18, wherein mechanically rounding the edge of the silicon wafer includes mechanically rounding the edge with a grinding wheel having a concave, semicircular grinding surface.

20. The method of claim 14, wherein applying an electrical potential across the crucible includes applying an electrical potential across the crucible while pulling a nitrogen-doped silicon crystal from the melt.

21. The method of claim 14, wherein applying an electrical potential across the crucible includes applying a constant electrical potential across the crucible while pulling a nitrogen-doped silicon crystal from the melt.

22. The method of claim 14, wherein applying an electrical potential across the crucible includes applying an electrical potential of 3–24V across the crucible.

23. The method of claim 14, wherein pulling a nitrogen-doped silicon crystal from the melt includes pulling a nitrogen-doped silicon crystal from the melt at a rate greater than 1.1 mm/min.

* * * * *